United States Patent [19]
Fukuda

[11] Patent Number: 5,328,784
[45] Date of Patent: Jul. 12, 1994

[54] REFLECTION MASK, METHOD OF PRODUCING MASK AND METHOD OF FORMING PATTERN USING THE MASK

[75] Inventor: Hiroshi Fukuda, Kokubunji, Japan
[73] Assignee: Hitachi, Ltd., Tokyo, Japan
[21] Appl. No.: 755,126
[22] Filed: Sep. 5, 1991
[30] Foreign Application Priority Data Sep. 10, 1990 [JP] Japan .................... 2-236959

[51] Int. Cl.$^5$ ................................ G03F 9/00
[52] U.S. Cl. ....................... 430/5; 430/321; 378/34; 378/35
[58] Field of Search ............ 430/5, 22, 269, 311, 430/321; 378/34, 35

[56] References Cited

U.S. PATENT DOCUMENTS 5,045,417 9/1991 Okamoto ........................ 430/5
5,190,836 3/1993 Nakagawa et al. ............. 430/5

OTHER PUBLICATIONS

Journal Vacuum Science Technology, B8 (6), Nov./-Dec. 1990, "Soft X-Ray Projection Lithography", pp. 1325-1328.

*Primary Examiner*—Steve Rosasco
*Attorney, Agent, or Firm*—Fay, Sharpe, Beall, Fagan, Minnich & McKee

[57] ABSTRACT

By using a reflection mask for reflective reduction projection exposure which uses vacuum ultraviolet rays or soft X-rays of wavelength $\lambda$, there is enhancement of the resolution of the projection exposure by making the height of adjacent or neighboring reflective surfaces to be deviated by about $(2n-1) \times \lambda/(4 \cos \Theta)$ (where n=1, 2, 3, ---) with respect to the angle $\Theta$ subtended by the normal to the above reflective surfaces and the direction of incidence of the ultraviolet rays or the soft X-rays, thus inverting the phases of the vacuum ultraviolet rays or the soft X-rays reflected by the neighboring reflection regions. Therefore, the applicable range of the reduction projection exposure can be extended to 0.1 um or smaller.

15 Claims, 4 Drawing Sheets

REFLECTION MASK, METHOD OF PRODUCING MASK AND METHOD OF FORMING PATTERN USING THE MASK

BACKGROUND OF THE INVENTION

The invention relates to a projection exposure for forming fine patterns on a variety of solid state devices.

Circuit patterns have been formed in ever finer sizes in order to increase the degree of integration of solid state devices such as LSIs and to increase the speed of circuit operation. A reduction projection exposure method that features mass-producibility and excellent resolution has been used widely for forming such patterns. According to this method, the resolution varies in proportion to the exposure wavelength and varies in inverse proportion to the numerical aperture (NA) of the projection optical system. So far, it has been attempted to increase the resolution limit by increasing the numerical aperture (high NA). This method, however, is approaching its limit due to a decrease in the depth of focus and difficulty in the design of lenses and lens fabrication technology. In recent years, therefore, attention has been given to the approach for shortening the wavelength of the exposure light.

When use is made of vacuum ultraviolet rays such as from laser beams or soft X-rays such as SR light (synchrotron radiation light) as a source of light of short wavelengths, there is available no material that is adapted to the refractive optics (lenses) used thus far, and it becomes necessary to employ a reflection optical system. From the standpoint of precision and mechanical durability, a reflection mask is preferred to a transmission mask. The reflective reduction projection exposure method using vacuum ultraviolet rays or soft X-rays has been discussed in, for example, materials of the Academy of the Japanese Association of Electric Engineering, EDD-90-40, 1990, pp. 47–54 and "Soft x-ray Projection Lithography", Ceglio N. M. et al, J. Vac. Science Technology, B8 (6), Nov/Dec 1990. p. 1325–1328.

There has been proposed a phase shifting method in order to further enhance the resolution limit of the conventional reduction projection exposure method using refractive optics. According to this method, phases of light beams passing through neighboring opening patterns are inverted relative to each other in order to nearly double the spatial frequency response of the optical system for the repetitive patterns. In this method, a phase inverting plate (phase shifter) having a suitable index of refraction and is suitable thickness is selectively provided at a predetermined opening portion of the transmission mask to impart an effective optical path difference to the light beam passing through the neighboring opening patterns in order to invert the phases of light beams. The phase shifting method has been discussed in, for example, IEEE Transaction on Electron Devices, Vol. ED-29, No. 12, pp. 1828–1835, 1982.

SUMMARY OF THE INVENTION

The principle of the phase shifting method for conventional refractive, reduction projection has been found to hold true, by the present invention, even when used in the reflective reduction projection exposure method that uses vacuum ultraviolet rays or soft X-rays. Moving from the principle to practice poses problems as described above, and the conventional phase shifting method is based on a prerequisite of using the transmission mask. When it is attempted to apply the phase shifting method in the refractive reduction projection exposure method that uses vacuum ultraviolet rays or soft X-rays, however, use of the transmission mask is not desirable as mentioned above. No material is found having a refractive index and a transmittance suited to being used as a phase shifter in this wavelength region for the transmission method. This holds true even when it is attempted to provide the surface of the reflection mask with a phase shifter similar to the phase shifting mask of the transmission type.

The object of the present invention is to provide a reflection mask for the reflective reduction projection exposure method that uses vacuum ultraviolet rays or soft X-rays, of a wavelength preferably within the range of 5 nm to 200 nm; particularly the reflection mask features a new structure that enables the phase shifting method to be put into practice.

The above object is achieved by a reflection mask for the reflective reduction projection exposure method that uses vacuum ultraviolet rays or soft X-rays having a wavelength $\lambda$ wherein the height of reflective surfaces between the neighboring or adjacent patterns is deviated, particularly by about $(2n-1) \times \lambda/(4 \cos \Theta)$ (where $n = 1, 2, 3, \cdots$) relative to the angle $\Theta$ subtended by the normal to the reflective surfaces and the direction of incidence of the ultraviolet rays or X-rays.

BRIEF DESCRIPTION OF THE DRAWING

Further objects, features and advantages will become more clear from the following detailed description of the drawing, wherein.

DETAILED DESCRIPTION OF THE DRAWING

Figure 1:
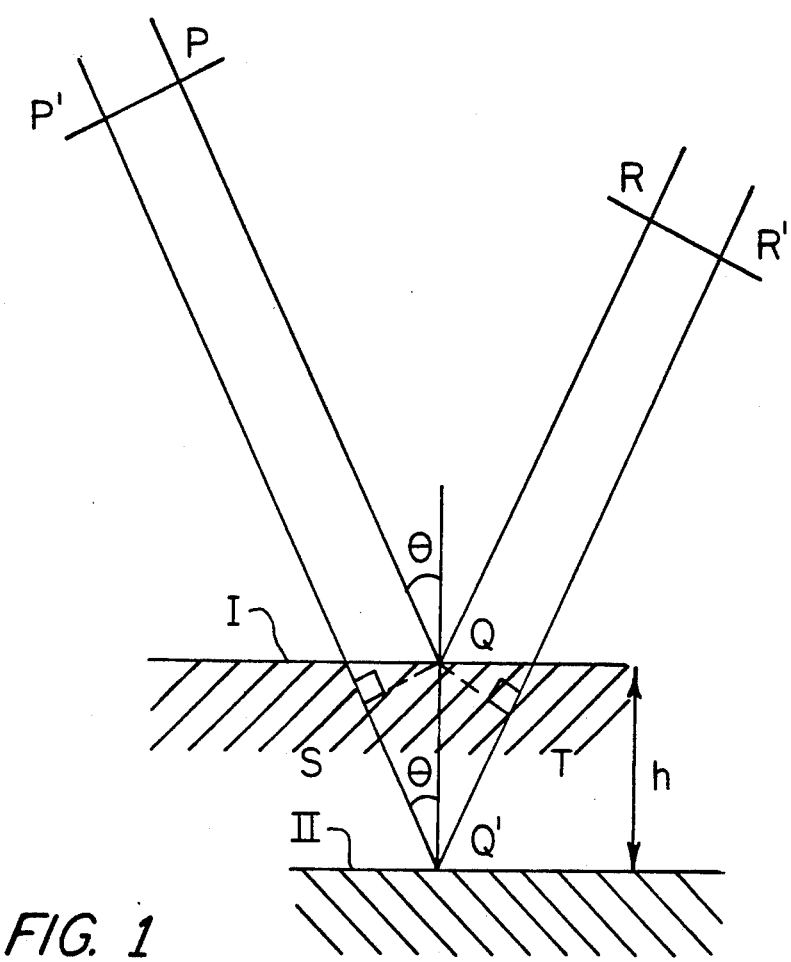
FIG. 1 is a diagram which schematically illustrates the principle of the present invention.

Operation of the invention will now be described with reference to FIG. 1 which is a diagram schematically illustrating the principle of the present invention.

A light beam of wavelength $\lambda$ having a uniform wave front (the locus of points having the same phase at the same time) is incident on the reflective surfaces of the mask in a direction of the arrows at an incident angle $\Theta$ (angle subtended by the normal of the reflective surfaces and the direction of incidence of light). Here, the reflective surface II is lower by a height h than the reflective surface I in the direction of the normal. The phases of coherent light beam reflected by the reflective surfaces are discussed below.

The light beams that have passed through points P and P' on the incident wave front having a neat phase relationship (most preferably a two dimensional planar wavefront perpendicular to the traveling direction) are respectively reflected by the reflective surfaces I and II, and the reflected light beams arrive at points R and R' on a plane perpendicular to the direction in which the reflected light beams travel. If the light beams at the points P and P' have the same phase, sin (w.t), the light beams at the points R and R' have phases which are:

$$R: \sin(w.t - k.PQR) \quad (1)$$

$$R': \sin(w.t - k.P'Q'R') \quad (2)$$

where w denotes the frequency of light, t denotes time, and $k = 2\pi/\lambda$ denotes a wave number ($\lambda$ is the wavelength of the light beams).

Here, if S and T are the intersections of perpendiculars from the point Q to the lines P'Q' and Q'R', respectively, then, $$P'Q'R' = P'S + SQ'T + TR'$$

because P'SQP and RQTR' are rectangles, $$P'S = PQ \text{ and } TR' = QR$$

therefore $P'Q'R' = PQ + SQ'T + QR \quad (3)$ $= PQR + SQ'T$ (since $PQ + QR = PQR$)
$= PQR + 2h\cos\theta$ If (3) is substituted into (2), then the phase of the reflected light beam at the point R' is, $$R': \sin(w \cdot t - k \cdot P'Q'R') \quad (4)$$

$= \sin(w \cdot t - k \cdot PQR - 2kh\cos\theta)$

If (1) is compared with (4), the phase difference of the light beams reflected by the reflection surfaces II and I become $2kh\cos\Theta$. Therefore, if $2kh\cos\Theta = (2n-1).\pi$, which is the phase angle in radians to have the phases of the beams at R and R' to be 180° out of phase ($360° = 2\pi$ radians, and therefore $(2n-1)\pi$ radians is an odd integer multiple of 180°). or $h = (2n-1) \times \lambda/(4\cos\Theta)$ (substituting $k=2\pi/\lambda$ and solving for h)

(where $n = 1, 2, 3, \cdots$)

then, the phase of a light beam reflected by the reflective surface II can be inverted relative to the phase of a light beam reflected by the reflective surface I. Therefore, the phase shifting method can be realized by using the reflection mask of FIG. 1.

EXAMPLE 1

The steps for producing the reflection mask according to a first example of the present invention will now be described with reference to FIG. 2.

Figure 2A:
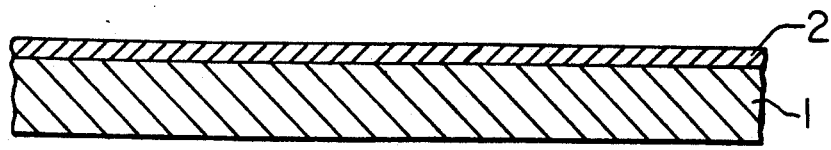
FIGS. 2a–2d are structural section views showing the steps for producing the reflection mask according to an example of the present invention.
Figure 2B:
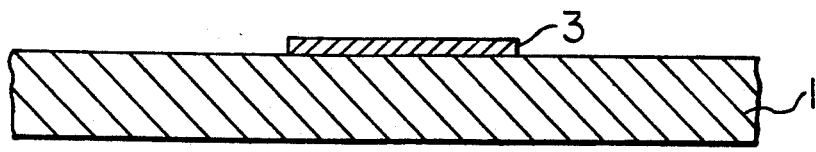
Figure 2C:
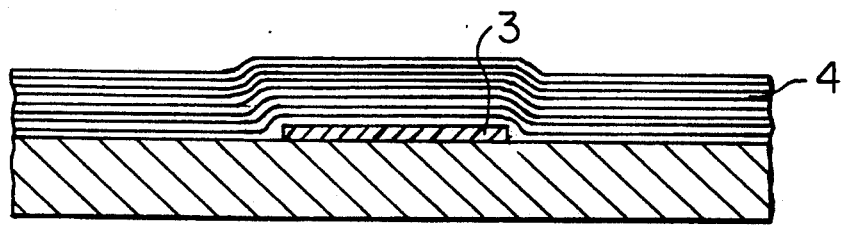

First, an SiO₂ film 2 is formed by the ion beam sputtering method to form a thickness of 4.6 nm on a silicon substrate 1 (FIG. 2a). This film thickness is selected presuming a mask incident angle Θ of about 30 degrees for the soft X-ray of a wavelength of 16 nm. On the SiO₂ film is applied a resist. Electron beam writing and a predetermined resist treatment are effected for a predetermined pattern in a region including a portion for inverting the phases among the reflective pattern regions. Using the formed resist pattern as a mask, the SiO₂ film is etched and the resist mask removed to form a desired SiO₂ raised (difference in level) pattern 3 (FIG. 2b). Next, the whole surface is coated with an Si/Mo multilayer 4 (FIG. 2c). Here, the period (i.e. repetition) and the number of layers of the multilayer 4 are selected to be best adapted to the wavelength of the light beam and the mask incident angle Θ of the light beam. The multilayer is coated again with the resist, and the electron beam writing and a predetermined resist treatment are effected for a predetermined pattern (reflective pattern region) to form a resist pattern. Next, gold is deposited as a soft X-ray absorber on the whole surface, the resist pattern is lifted off, and a pattern 5 of the gold absorber is formed on the non-reflective region to form neighboring surfaces I and II (FIG. 2d).

Figure 3:
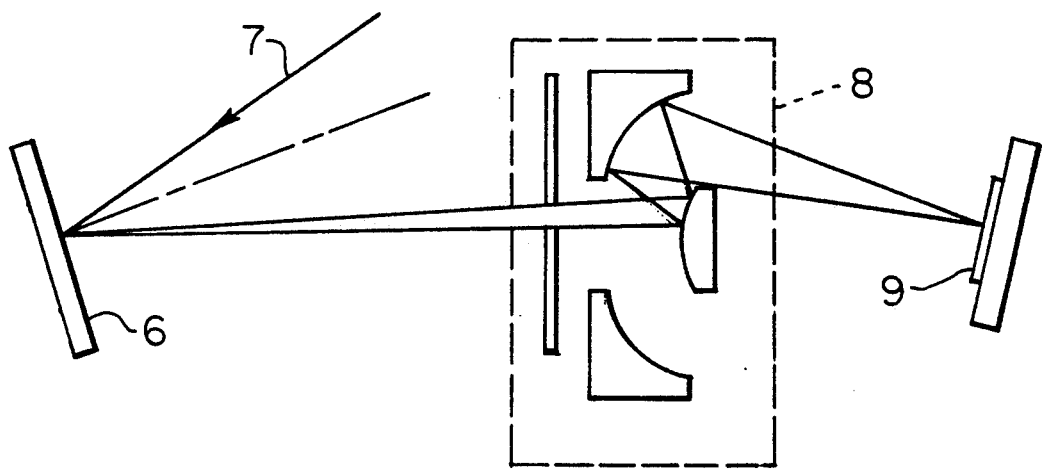
FIG. 3 is a diagram showing the outline of the reflective reduction projection exposure system used with the mask according to the present invention.
Figure 2D:
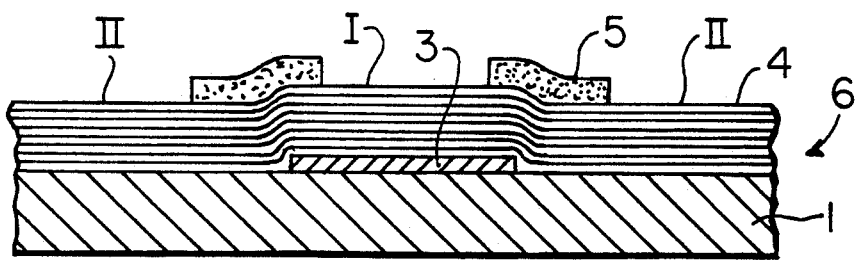

Using the thus formed reflection mask 6, of FIG. 2(d), a pattern was transferred employing a reflective reduction projection exposure apparatus shown in FIG. 3. A soft X-ray with a wavelength of 16 nm obtained from an SR (synchrotron orbital radiation) ring is used as exposure SR light 7, a Schwarzschild's reflection lens (reducing magnification = 1/20) having NA=0.1 is used as an optical system 8, and a silicon wafer coated with PMMA (polymethylmetharylate) maintaining a thickness of about 0.1 um is used as a substrate 9 to be exposed. Exposure testing showed that it is possible to form various patterns of sizes smaller than 0.1 um including a 0.05 um line-and-space pattern. A change in the focal position caused by deviation of the reflective surfaces was smaller than a measurable limit and presented no problem.

Though this embodiment employs the silicon substrate as a mask substrate, it is allowable to use any other substrates such as fused silica substrate in addition to the above substrate or to form the mask on one layer of one or more layers on a substrate.

Moreover, the difference-in-level (i.e. adjacent surfaces having a different height) pattern may be formed using any other material and any other method in addition to the one obtained by etching the SiO₂ film. For instance, there can be used a thermally oxidized film, or vacuum deposition, sputter deposition or ion cluster beam deposition of a metal such as gold or tungsten, and in combination with lift off. Here, however, the difference in level must be sufficiently high and precise, and the surface must be flat. That is, variance in the height of each surface (flatness) should be smaller than 10% of the difference in level h between adjacent surfaces (a variance of about 4 angstroms in this example). In this example, the height or difference in level corresponds to the case where n is 1 in the equation (5). The invention is applicable, as a matter of course, even when the value n assumes any other natural number.

The multilayer materials and the absorber need not be limited to the ones mentioned above, and may be used in various combinations. The method of forming the pattern of the absorber need not be limited to the lift off method, and the difference in height pattern may be formed by ordinary lithography followed by etching after the multilayer has been formed on the whole surface. The difference in level or height h preferably corresponds to one-half the period of the multilayer.

When reflecting an x-ray, a portion of an x-ray is reflected at the first interface of the mirror, and the remaining portion travels into the mirror; therefore, with respect to a multi-layer mirror, enough layers are provided to substantially reflect the entire or meaningful part or the x-ray beam, for efficiency. If the thickness of the layers or spacing between the interfaces of the layers is uniform for all the layers and has the above relationship such that h corresponds to ¼ the period, the reflective portions at each interface will still have the phase change with respect to reflected portions of the adjacent surface, of surfaces I and II, so that interference will take place. Also, if the number of layers forming the surface I is equal to the number of layers forming II and they have the period relationship as set forth above, the reflected portion of the X-ray at any interface of the mirror surface (here the term surface is used loosely since the surface is in fact a plurality of stacked surfaces for the multi-layer mirror) will be 180° out of phase with a corresponding portion of the X-ray beam reflected from a mirror interface at the same depth for the other surface of surfaces I and II. Therefore, the effect of the present invention is not obtained from the difference in level that is formed by etching the multilayers themselves. The numbers of layers of the multilayer over the pattern 3 should be equal to the number of layers over the adjacent substrate 1 from the standpoint of uniformity of the reflectivity.

According to this example, a small number of fine defects are found in the multilayer that are smaller than the resolution limit of the reflection optical system and they do not become a problem in delineating the patterns of reflected light. This is due to the fact that the beam defects, whose sizes are smaller than $0.25 \times \lambda/NA$ when reduction projected onto the wafer, are not practically transferred. On the contrary, the effect of defects can be avoided by selecting the reducing magnification $r$ ($<1$) to be $d \times r < 0.25 \times \lambda/NA$. However, desirably these defects should not exist from the first.

In the present invention, the problems relate to the phase difference only among the neighboring reflection regions. Therefore, flatness for the length of about several times the size of pattern on the mask plays a particularly important role for the substrate, the difference-in-level pattern and the multilayer.

Spherical or aspherical figured substrates can be used as the reflective mask substrates. In this case, adjacent reflective surfaces are not strictly parallel. However, the size of each reflective pattern is much smaller than the radius of sphere of figured substrates. Therefore it is possible to consider that adjacent reflective surfaces are parallel.

The exposure wavelength, the kind or type of the reflective projection optical system, NA, reduction magnification $r$ and mask incident angle $\Theta$ of exposure light, are not necessarily limited to those mentioned in the above embodiment. For example, a wide exposure field can be realized by adopting a scan exposure system in which the mask and the substrate are moved in synchronism with each other. The height h of the difference-in-level pattern, period of the multilayer, number of layers, materials thereof and the absorbing material must be optimized depending upon the exposure wavelength and the mask incident angle $\Theta$.

Moreover, the substrate and the resist process are not necessarily limited to those mentioned in the above embodiment. Furthermore, the invention is not limited to the ordinary resist process, but any other radiation-assisted surface reaction process such as photo-assisted CVD (chemical vapor deposition), photo-assisted etching, photo-assisted MBE (molecular beam epitaxy), or photo-assisted surface modification may be used in combination. In particular, the resist material should exhibit an extremely small transmission factor for the vacuum ultraviolet rays and soft x-rays. Therefore, they should be used in combination with a process which utilizes the surface reaction.

EXAMPLE 2

The steps for producing the reflection mask according to another example of the present invention will now be described with reference to FIG. 4.

Figure 4A:
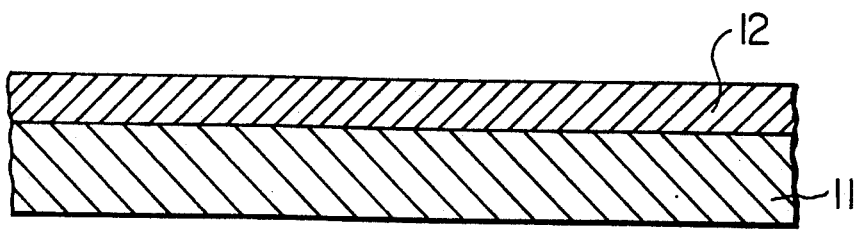
FIGS. 4a–4d are structural section views showing the steps for producing the reflection mask according to another example of the present invention.
Figure 4B:
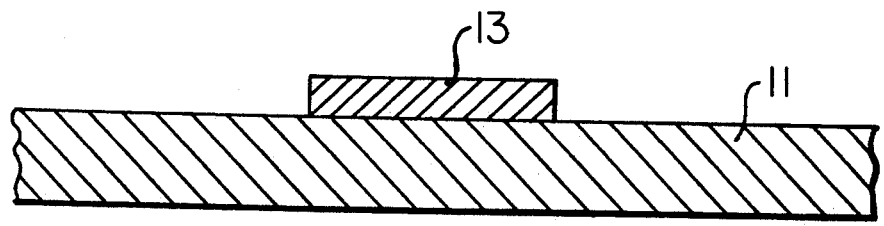
Figure 4C:
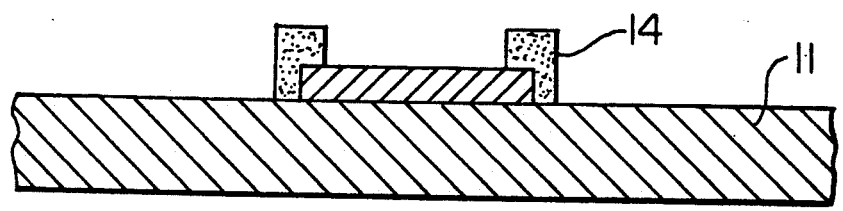
Figure 4D:
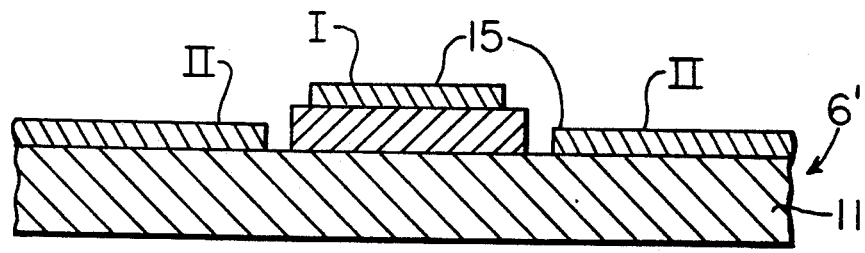

First, an $SiO_2$ film 12 is formed by the ion beam sputtering method maintaining a thickness of 45.3 nm on a silicon substrate 11 (FIG. 4a). This film thickness is selected presuming a mask incident angle $\Theta$ of about 30 degrees for the $F_2$ laser beam of a wavelength of 157 nm. On the $SiO_2$ film is applied a resist, and electron beam writing and a predetermined resist treatment are effected for a predetermined pattern (region including a portion for inverting the phases among the reflective pattern regions). Using the formed resist pattern as a mask, the $SiO_2$ film is etched to form a desired $SiO_2$ difference-in-level pattern 13 (FIG. 4b). Next, the resist is applied again, and the electron beam writing and a predetermined resist treatment are effected for a predetermined pattern (non-reflective pattern region) to form a resist pattern 14 (FIG. 4c). Thereafter, a thin Pt film is deposited on the whole surface, and the resist pattern is lifted off to form a Pt reflection film pattern 15 on a predetermined mask reflection region only (FIG. 4d). The region without the Pt reflection film pattern does not reflect the exposure light ($F_2$ laser beam) but works as an absorption pattern. The Pt reflection film pattern forms difference in level neighboring or adjacent reflective surfaces I and II.

The reflective reduction projection exposure is effected using the thus formed mask 6'. The $F_2$ laser beam having a wavelength of 157 nm is used as exposure light, a Schwarzschild's reflection lens having NA=0.4 is used as an optical system, and a silicon wafer coated with about 0.1 um of PMMA is used as a substrate to be exposed. The exposure testing shows it is possible to form various patterns of sizes smaller than 0.2 um, in a line-and-space pattern.

Here, the substrate, difference-in-level pattern, material of the reflection film or the method of its formation, exposure wavelength, type of projection optical system, NA, mask incident angle $\Theta$ of exposure light, and resist processing are in no way limited to those of the above second example, like in the case of the first example.

EXAMPLE 3

Figure 5:
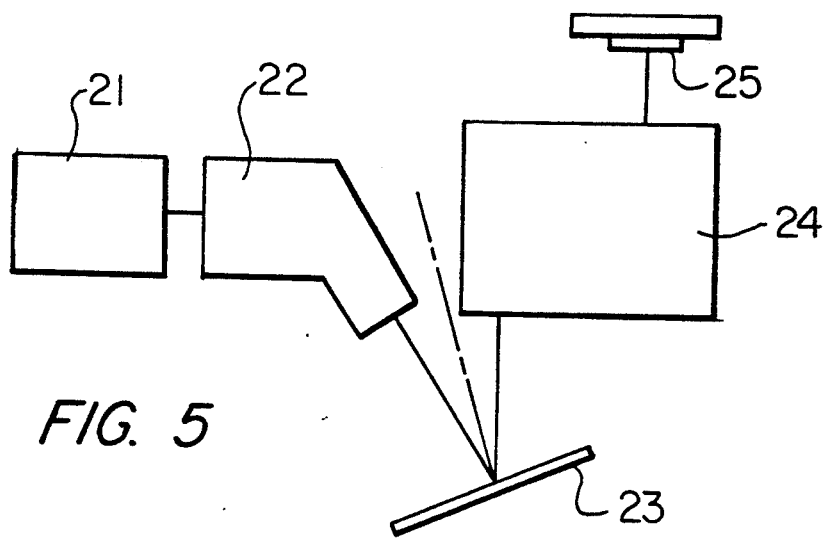
FIG. 5 is a diagram showing the outline of the reflective reduction scan-type projection exposure method used with the mask according to the present invention.

The mask 6, 6' according to the present invention is adapted to a so-called reduction scan-type exposure system. The reduction scan-type exposure system usually uses a transmission mask. However, FIG. 5 schematically illustrates an apparatus that is modified to use the reflection mask 6, 6'. Vacuum ultraviolet light (wavelength, 193 nm) obtained from an ArF excimer laser 21 passes through an illumination optical system 22, is reflected by the reflection mask 23 (6, 6') of the present invention and is patterned while being imparted with the phase difference, and further passes through a reduction scan-type optical system 24 (NA=0.4) to arrive at a substrate 25 that is to be exposed. The reflection mask 23 and the surface of the substrate 25 to be exposed are at conjugate positions relative to each other with respect to the reduction scan-type optical system 24. The exposure is carried out while moving the reflection mask 23 and the substrate 25 to be exposed in synchronism with each other with respect to the reduction scan-type optical system 24.

The reflection mask 23 fundamentally has the same structure as the mask 6 shown in the first example, but the reflection multilayer is composed of a dielectric multilayer best adapted to the wavelength 193 nm and the absorber is made up of a $SiO_2$ film. It is allowable to use a suitable thin metal film instead of the multilayer film and to use a suitable absorption material such as silicon nitride film as the absorber. Furthermore, the difference in level h of the mask is greater than that of the first example, and the flatness is not required to be as much as that of the first example. Therefore, the difference in level of the mask may be formed by etching the substrate itself.

The phase shifting method uses interference between adjacent light beams reflected at substantially the same time whose phases are inverted relative to each other. Thus, it is desired that at least two adjacent reflective surface having difference in the level should lies within one exposure region. Therefore, the width of incident beam or beam slit to be scanned must be sufficiently great relative to the size of pattern on the mask and preferably at least twice as great. When the scanning system is to be employed, furthermore, it is desired that the edge of the exposure region which is parallel with the scanning direction has an edge gradient of light intensity that will half overlap the edge gradient of the next scan so that the overlapping edge gradients will add to equal the light intensity of the main portion of the exposure region for a suitable exposure quantity. This makes it possible to avoid the problem where no interference develops at portions where the scannings are spliced together.

In practice of the present invention, transfer of a pattern makes it passible to form a variety of patterns of sizes smaller than 0.2 um inclusive of a 0.1 um line-and-space pattern like those of the second example.

Here, it should be noted that the exposure wavelength, NA of the projection optical system and resist processing are in no way limited to those of the above example like in the case of the first example.

EXAMPLE 4

Figure 6A:
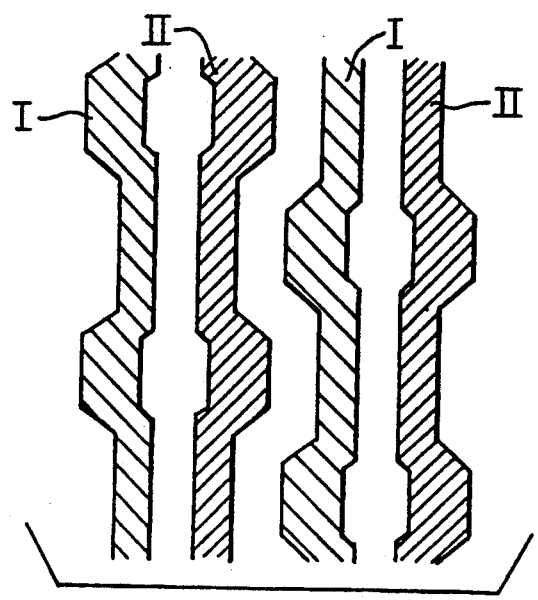
FIG. 6(a) is a top plan view showing the topology of a mask used during the fabrication of LSI's, particularly with respect to a gate pattern.
Figure 6B:
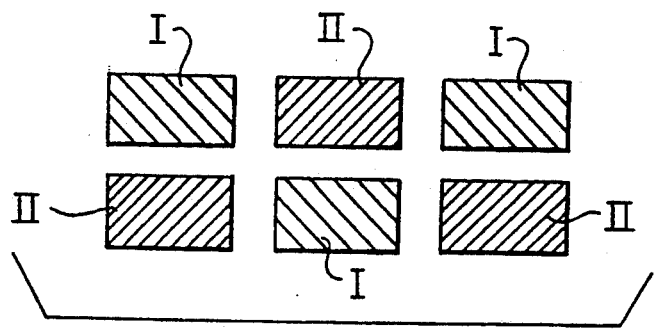
FIG. 6(b) is a top plan view of the topology of a mask used in fabricating the same LSI referred to with respect to FIG. 6(a), but with respect to a capacitor pattern.
Figure 7:
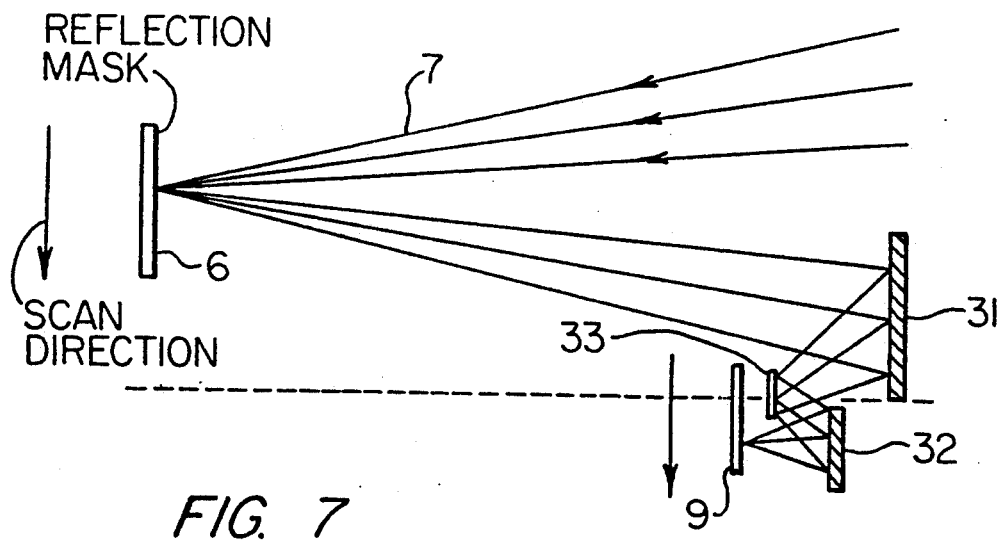
FIG. 7 is a schematic illustration of scanning apparatus using the masks of FIG. 6(a) and (b) in the making of LSI.

1 Gbit DRAMs were fabricated using the scanning type soft x-ray reduction projection exposure apparatus with the reflective phase-shifting mask as formed in the Example 1 to have the configurations shown in FIGS. 6(a) and (b). The reflective phase-shifting mask was applied mainly to the gate patterns, for example, FIG. 6(a), the capacitor patterns, for example, FIG. 6(b) and wiring patterns of the space and line variety, where especially small feature size is required. The period of the gate pattern of FIG. 6(a) was 0.2 microns. The scanning-type soft x-ray reduction projection exposure apparatus used Is schematically shown in FIG. 7. The exposure wavelength was 14 nm and the numerical aperture of reflective optics, NA, was 0.08. The mask pattern feature and the optical system are no way limited to those of the above embodiment, according to the broader aspects. With this method, the resist patterns were obtained with good profile and high mask pattern shape fidelity, both in the memory array regions and in the peripheral circuit regions. Furthermore, the LSI devices fabricated according to this example 4 showed good electrical properties.

For the layers where fine patterns are not required, normal reflective masks were used, which do not introduce a phase change into reflected light beams. It is of course, possible to use other lithography techniques such as the conventional optical lithography using ultra-violet light for these patterns. The present method of Example 4 was effective for fabricating the 1 Gbit DRAMs and it can be used for fabricating other devices.

In FIGS. 6(a) and (b), the reflective surfaces I and II alternate for adjacent reflective surfaces, and are separated from each other by non-reflective surfaces (with no field pattern in the drawing).

In FIG. 7, the scanning direction is shown by the arrows and the optics comprise concave mirrors 31 and 32, which cooperate with the convex mirror 33.

While a preferred embodiment has been set forth along with modifications and variations to show specific advantageous details of the present invention, further embodiments, modifications and variations are contemplated within the broader aspects of the present invention, all as set forth by the spirit and scope of the following claims.

I claim:

1. A reflection mask used for optically forming patterns, comprising:
   a plurality of optically reflective surfaces for reflecting at least one of ultraviolet rays and X-rays of a wavelength, said reflective surfaces having different levels to change the phase relationship between rays respectively reflected by said reflective surfaces of different levels;
   wherein said reflective surfaces each consist of a multilayer mirror; and
   wherein the different levels between adjacent ones of said reflective surfaces correspond to one-half the period of the multilayer of the multilayer mirror.

2. A reflection mask according to claim 1, wherein said reflective surfaces adjacent each other are sufficiently spaced apart to provide the different levels and to invert the phase of the at least one of ultraviolet rays and x-rays reflected by the adjacent reflective surfaces respectively.

3. A reflection mask according to claim 2 wherein each of said reflective surfaces has a variance in height, in the direction of the different levels, smaller than about 4 angstroms.

4. A reflection mask according to claim 2, wherein the number of layers of the multilayer mirror of each of the reflective surfaces are equal to each other for uniformity of reflectivity.

5. A reflection mask according to claim 4, further including ray absorption material between adjacent reflective surfaces.

6. A reflection mask according to claim 1, further including ray absorption material between adjacent reflective surfaces.

7. A method of forming a pattern with the reflection mask of claim 1, comprising the steps of:
   forming at least two parallel spaced apart, adjacent, beams of at least one of ultraviolet rays and soft X-rays of a wavelength within the range of 5 nm to 200 nm;
   projecting the beams respectively on adjacent reflective surfaces of the reflection mask at a substantial acute angle θ that is subtended by a normal to the reflective surfaces and the direction of incidence of the beams while maintaining the reflective surfaces parallel and at a difference in level sufficient to phase shift the beams as they are reflected from the surfaces so that the phase of the adjacent beams will be inverted after reflection from the respective adjacent reflective surfaces;

passing the reflected beams through an optical system and thereby optically reducing the reflected beams to produce reduced adjacent beams;

projecting the reduced adjacent beams onto a substrate and thereby exposing a surface layer of the substrate; and forming an integrated semiconductor circuit using the exposed surface layer.

8. The method of claim 7, further including providing each of the reflective surfaces with a variation in height smaller than 10% of the difference in level between adjacent reflective surfaces.

9. The method of claim 8, wherein said step of providing provides the variation in height for each of the reflective surfaces to be smaller than about 4 angstroms.

10. The method of claim 7, further including absorbing radiation in absorber areas between adjacent reflective surfaces.

11. Apparatus for forming integrated circuits, including the reflection mask of claim 1 and further comprising:

light source means for projecting an exposure beam of one of ultraviolet rays and soft X-rays, of wavelength λ within the range of 5 nm to 200 nm and of coherent light as a uniform wave front;

said reflection mask being mounted so that its reflective surfaces of different levels substantially simultaneously reflect adjacent portions of said exposure beam so that the adjacent reflected beam portions have a corresponding wave front and are about 180° out of phase with respect to each other, and so that the angle of incidence of the beam is acute with respect to a normal to the reflective surfaces;

optical system means for optically reducing the adjacent reflected beam portions to form a reduced size exposure pattern; and means for holding a partially formed integrated circuit in the path of the reduced size exposure pattern so that the beam portions photoreact with the surface of the partially formed integrated circuit.

12. A method of forming a photoreactive surface pattern on an integrated circuit portion during the fabrication of at least LSI, comprising the steps of:

forming a beam of soft X-rays of a wavelength λ;

providing a mask substrate formed of different surfaces in the pattern so that the height of the surfaces that are adjacent each other differ by about $(2n-1) \times \lambda/(4 \cos \theta)$ (wherein n = 1, 2, 3, - - - ), and wherein the angle θ is subtended by a normal to said different surfaces and the direction of incidence of the soft X-rays;

providing as deposits on the different surfaces multi-layer soft X-ray mirrors as respective different level adjacent reflective surfaces, respectively differing in level corresponding to one-half the period of the multi-layer of the multi-layer mirror to thereby provide a reflection mask;

projecting the beam simultaneously on adjacent reflective surfaces of the reflection mask at the substantial acute angle θ that is subtended by a normal to the reflective surfaces and the direction of incidence of the beam to the reflective surfaces, while maintaining the reflective surfaces respectively differing in level sufficiently to phase shift different portions of the beam as they are reflected from the surfaces so that the phase of the adjacent reflected different portions of the beam will be inverted with respect to each other after reflection from the respective reflective surfaces;

passing the reflected portions of the beam through a reduction reflecting optical system and optically reducing the reflected portions of the beam to produce reduced adjacent portions of the beam;

projecting the reduction adjacent portions of the beam onto a workpiece substrate for exposing a surface layer of the workpiece substrate; and forming an integrated semiconductor circuit using the exposed surface layer.

13. The method of claim 12, further including providing the multi-layer mirror with the number of layers of the multi-layers for adjacent reflective surfaces to be equal to each other to provide uniformity of the reflectivity.

14. A method of forming a mask for radiation of wavelength λ to produce a photoreactive surface pattern on an integrated circuit portion during the fabrication of at least LSI, comprising the steps of:

throughout a mask substrate, forming surfaces in the pattern so that the height of the surfaces that are adjacent each other differ by about $(2n-1) \times \lambda/(4 \cos \theta)$ (wherein n = 1, 2, 3, - - - ), and wherein the angle θ is subtended by a normal to said reflective surfaces and the direction of incidence of the radiation of a wavelength λ; and depositing on the surfaces multi-layer soft X-ray mirrors as different level adjacent reflective surfaces respectively differing in level corresponding to one-half the period of the multi-layer of the multi-layer mirror.

15. A method of claim 14, further including providing the multi-layer mirror with the number of layers of the multi-layers for adjacent reflective surfaces to be equal to each other to provide uniformity of the reflectivity.

* * * * *